US011895892B2

(12) United States Patent
Lim et al.

(10) Patent No.: US 11,895,892 B2
(45) Date of Patent: Feb. 6, 2024

(54) DISPLAY APPARATUS INCLUDING VOID OF LIGHT EMITTING LAYER

(71) Applicant: LG Display Co., Ltd., Seoul (KR)

(72) Inventors: Hyeongjun Lim, Paju-si (KR); Ho-Jin Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 120 days.

(21) Appl. No.: 17/561,211

(22) Filed: Dec. 23, 2021

(65) Prior Publication Data
US 2022/0208889 A1 Jun. 30, 2022

(30) Foreign Application Priority Data
Dec. 31, 2020 (KR) ........................ 10-2020-0189671

(51) Int. Cl.
*H10K 59/35* (2023.01)
*H10K 50/818* (2023.01)
(52) U.S. Cl.
CPC ......... *H10K 59/353* (2023.02); *H10K 50/818* (2023.02); *H10K 59/351* (2023.02)
(58) Field of Classification Search
None
See application file for complete search history.

(56) References Cited

U.S. PATENT DOCUMENTS

2021/0202651 A1* 7/2021 Im .................. H10K 59/122

FOREIGN PATENT DOCUMENTS

KR   10-2020-0082491 A    7/2020

* cited by examiner

*Primary Examiner* — Suberr L Chi
(74) *Attorney, Agent, or Firm* — Birch, Stewart, Kolasch & Birch, LLP

(57) ABSTRACT

A display apparatus can include a substrate including a plurality of subpixels and a plurality of contact portions provided on one side of each of the plurality of subpixels, an insulating layer provided on the substrate, a first electrode provided in each of the plurality of subpixels and each of the plurality of contact portions on the insulating layer, a fence provided on the first electrode, a light emitting layer provided on the insulating layer, the fence, and the first electrode, a second electrode provided on the light emitting layer, a filling layer provided on the second electrode, and a trench provided in the fence and the insulating layer. The trench can include a first trench provided between the contact portions adjacent to each other and a second trench provided between the subpixels adjacent to each other.

20 Claims, 10 Drawing Sheets

DISPLAY APPARATUS INCLUDING VOID OF LIGHT EMITTING LAYER

CROSS-REFERENCE TO RELATED APPLICATIONS

This application claims the priority benefit of the Korean Patent Application No. 10-2020-0189671 filed in the Republic of Korea on Dec. 31, 2020, the entire contents of which are hereby expressly incorporated by reference as if fully set forth herein into the present application.

BACKGROUND

Field of the Invention

The present disclosure relates to a display apparatus.

Discussion of the Related Art

With the development of the information society, demand for display apparatuses for displaying an image has increased in various forms. Accordingly, various display apparatuses such as liquid crystal displays (LCDs), plasma display panels (PDPs), and organic light emitting displays (OLEDs) have recently been used.

Among such display apparatuses, an organic light emitting display apparatus is a self-luminous type display apparatus, which has superior viewing angle and contrast ratio compared to an LCD, is lightweight and thin because it does not require a separate backlight, and is advantageous in power consumption. In addition, the organic light emitting display apparatus can be driven with a low DC voltage, has a fast response speed, and incurs low manufacturing cost.

Meanwhile, in a related art, in a plurality of pixels of an organic light emitting display, a lateral leakage current (LLC) can flow between neighboring pixels to deteriorate display quality.

SUMMARY OF THE DISCLOSURE

Accordingly, the present disclosure is directed to providing a display apparatus that substantially obviates one or more problems due to limitations and disadvantages of the related art.

An aspect of the present disclosure is directed to providing a display apparatus, which includes an encapsulation layer stably, while preventing an occurrence of a lateral leakage current.

Additional advantages and features of the disclosure will be set forth in part in the description which follows and in part will become apparent to those having ordinary skill in the art upon examination of the following or can be learned from practice of the disclosure. The objectives and other advantages of the disclosure can be realized and attained by the structure particularly pointed out in the written description and claims hereof as well as the appended drawings.

To achieve these and other advantages and in accordance with the purpose of the disclosure, as embodied and broadly described herein, there is provided a display apparatus including a substrate including a plurality of subpixels and a plurality of contact portions provided on one side of each of the plurality of subpixels, an insulating layer provided on the substrate, a first electrode provided in each of the plurality of subpixels and each of the plurality of contact portions on the insulating layer, a fence provided on the first electrode, a light emitting layer provided on the insulating layer, the fence, and the first electrode, a second electrode provided on the light emitting layer, a filling layer provided on the second electrode, and a trench provided in the fence and the insulating layer, wherein the trench includes a first trench provided between the contact portions adjacent to each other and a second trench provided between the subpixels adjacent to each other, the light emitting layer includes a void in the second trench, and the void is filled with a filler which is the same as a material constituting the filling layer.

In another aspect of the present disclosure, there is provided a display apparatus including a substrate including a plurality of subpixels, a first electrode provided in each of the plurality of subpixels on the substrate, a light emitting layer provided on the first electrode, a second electrode provided on the light emitting layer, a filling layer provided on the second electrode, and a trench provided between the plurality of subpixels, wherein the trench includes a first trench having a first width and a second trench having a second width smaller than the first width, and a portion of the light emitting layer is continuous in the first trench and is disconnected in the second trench.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the present disclosure and together with the description serve to explain the principle of the disclosure. In the drawings.

DETAILED DESCRIPTION OF THE EMBODIMENTS

Figure 1:
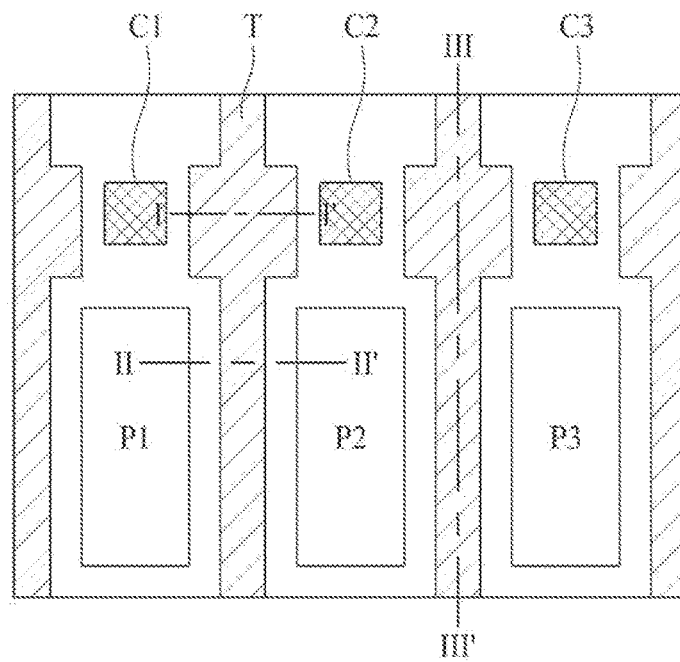
FIG. 1 is a schematic plan view illustrating an example of a display apparatus according to an embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure can, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted or may be briefly provided. In a case where 'comprise', 'have', and 'include' described in the present specification are used, another part can be added unless 'only~' is used. The terms of a singular form can include plural forms unless referred to the contrary.

In construing an element, the element is construed as including an error range although there is no explicit description.

In describing a position relationship, for example, when a position relation between two parts is described as 'on~', 'over~', 'under~' and 'next~', one or more other parts can be disposed between the two parts unless 'just' or 'direct' is used.

In describing a time relationship, for example, when the temporal order is described as 'after~', 'subsequent~', 'next~', and 'before~', a case which is not continuous can be included unless 'just' or 'direct' is used.

It will be understood that, although the terms "first", "second", etc. may be used herein to describe various elements, these elements should not be limited by these terms. These terms are only used to distinguish one element from another and may not define order. For example, a first element could be termed a second element, and, similarly, a second element could be termed a first element, without departing from the scope of the present disclosure.

In describing the elements of the present disclosure, terms such as first, second, A, B, (a), (b), etc., can be used. Such terms are used for merely discriminating the corresponding elements from other elements and the corresponding elements are not limited in their essence, sequence, or precedence by the terms. It will be understood that when an element or layer is referred to as being "on" or "connected to" another element or layer, it can be directly on or directly connected to the other element or layer, or intervening elements or layers can be present. Also, it should be understood that when one element is disposed on or under another element, this can denote a case where the elements are disposed to directly contact each other, but can denote that the elements are disposed without directly contacting each other.

The term "at least one" should be understood as including any and all combinations of one or more of the associated listed elements. For example, the meaning of "at least one of a first element, a second element, and a third element" denotes the combination of all elements proposed from two or more of the first element, the second element, and the third element as well as the first element, the second element, or the third element.

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together in co-dependent relationship.

Hereinafter, embodiments of the present disclosure will be described in detail with reference to the accompanying drawings.

FIG. 1 is a schematic plan view illustrating an example of a display apparatus according to an embodiment of the present disclosure. All the components of each display apparatus according to all embodiments of the present disclosure are operatively coupled and configured.

Referring to FIG. 1, the display apparatus can include first to third subpixels P1 to P3 configured to emit light, first to third contact portions C1 to C3 provided on one side of each of the first to third subpixels P1 to P3, and a boundary region between each of the subpixels P1 to P3. The first subpixel P1 can emit light of a first color, the second subpixel P2 can emit light of a second color, and the third subpixel P3 can emit light of a third color, but the present disclosure is not limited thereto.

The first contact portion C1 is a portion in which a first electrode (e.g., an anode electrode) in the first subpixel P1 is connected to a source or drain electrode of a driving thin film transistor (TFT), the second contact portion C2 is a portion in which a first electrode (e.g., an anode electrode) in the subpixel P2 is connected to a source or drain electrode of the driving TFT, and the third contact portion C3 is a portion in which a first electrode (e.g., an anode electrode) in the third subpixel P3 is connected to a source or drain electrode of the driving TFT. Also, a trench T can be provided between two adjacent contact portions C1 to C3 and between two adjacent subpixels P1 to P3. In this case, a width of the trench T provided between two adjacent contact portions C1 to C3 can be greater than a width of the trench T provided between the two adjacent subpixels P1 to P3.

Figure 2:
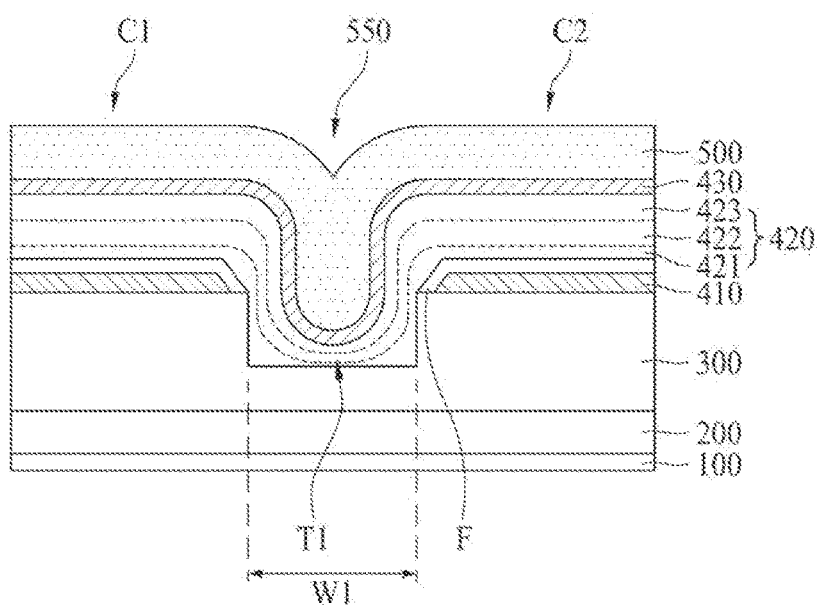
FIG. 2 is a schematic cross-sectional view of a display apparatus illustrating an example of a region across line I-I' of FIG. 1.

FIG. 2 is a schematic cross-sectional view of a display apparatus illustrating an example of a region across line I-I' of FIG. 1 and illustrating a first contact portion C, a second contact portion C2, and a boundary region between the first contact portion C1 and the second contact portion C2.

As can be seen from FIG. 2, the display apparatus according to an embodiment of the present disclosure includes a substrate 100, a circuit element layer 200, an insulating layer 300, a fence F, a first electrode 410, a light emitting layer 420, a second electrode 430, and a filling layer 500.

The substrate 100 can be formed of glass or plastic, but is not limited thereto, and can be formed of a semiconductor material such as a silicon wafer.

The display apparatus according to an embodiment of the present disclosure can be formed in a so-called top emission mode in which emitted light is emitted upward. Accordingly, as a material of the substrate 100, not only a transparent material but also an opaque material can be used.

The circuit element layer 200 is formed on the substrate 100. In the circuit element layer 200, circuit elements including various signal lines, thin film transistors (TFTs), and capacitors are provided. The signal lines can include a gate line, a data line, a power line, and a reference line, and the TFT can include a switching TFT, a driving TFT, and a sensing TFT.

The switching TFT is switched according to a gate signal supplied to the gate line and serves to supply a data voltage supplied from the data line to the driving TFT.

The driving TFT is switched according to a data voltage supplied from the switching TFT to generate a data current from power supplied from the power line and supply the generated data current to the first electrode 410.

The sensing TFT serves to sense a threshold voltage deviation of the driving TFT that degrades image quality, and in response to a sensing control signal supplied from the gate line or a separate sensing line, the sensing TFT supplies a current from the driving TFT to the reference line.

The capacitor serves to maintain a data voltage supplied to the driving TFT for one frame and is connected to a gate terminal and a source terminal of the driving TFT.

The insulating layer 300 is provided on the circuit element layer 200. The insulating layer 300 can be formed of an organic film such as acrylic resin, epoxy resin, phenolic resin, polyamide resin, polyimide resin, etc. Alternatively, the insulating layer 300 can be formed of an inorganic layer such as silicon nitride, aluminum nitride, zirconium nitride, titanium nitride, hafnium nitride, tantalum nitride, silicon oxide, aluminum oxide, or titanium oxide.

In a boundary region between two contact portions C1 and C2, a first trench T1 is provided in the insulating layer 300. The first trench T1 can penetrate through the fence F and can extend to a certain region inside the insulating layer 300 without penetrating through the insulating layer 300. However, the present disclosure is not necessarily limited thereto, and the first trench T1 can penetrate through the fence F and the insulating layer 300 and can extend to a certain region inside the circuit element layer 200 therebelow.

The first electrode 410 is provided on the insulating layer 300. The first electrode 410 is patterned for each subpixel and extends to the contact portions C1 and C2 as shown. The first electrode 410 is connected to a source or drain electrode of the driving TFT provided in a circuit element layer 200 in each of the contact portions C1 and C2. The first electrode 410 can function as an anode of the display apparatus.

The first electrode 410 is formed of a metal material or can be configured as a single layer or multiple layers formed of a metal material among aluminum (Al), silver (Ag), copper (Cu), magnesium (Mg), molybdenum (Mo), and titanium (Ti), or an alloy thereof.

A fence F is formed on the first electrode 410, and, in particular, is formed to cover the end of the first electrode 410 to prevent a current from being concentrated on the end of the first electrode 410. The fence F includes a first trench T1 and is formed in the contact portions C1 and C2 and in a portion of a boundary region between the contact portions C1 and C2 adjacent to each other.

The light emitting layer 420 is formed on the insulating layer 300 and the fence F. For example, the light emitting layer 420 is formed in both the two contact portions C1 and C2 and in a boundary region between the two contact portions C1 and C2.

The light emitting layer 420 can be provided to emit white W light. To this end, the light emitting layer 420 can include a plurality of stacks that emit light of different colors. Specifically, the light emitting layer 420 can include a first stack 421, a second stack 423, and a charge generating layer CGL 422 provided between the first stack 421 and the second stack 423.

The first stack 421 can include a hole injection layer, a first hole transport layer, a first organic light emitting layer, and a first electron transport layer being sequentially stacked, the second stack 423 can include a second hole transport layer, a second organic light emitting layer, a second electron transport layer, and an electron injection layer being sequentially stacked, and the charge generating layer 422 can include an N-type charge generating layer for supplying electrons to the first stack 421 and a P-type charge generating layer for supplying holes to the second stack 423.

The light emitting layer 420 is formed on a lower surface and side surfaces of the first trench T1. When the light emitting layer 420 is formed in the first trench T1, each of the first stack 421, the charge generating layer 422, and the second stack 423 can be formed to be continuous. However, a thickness of the light emitting layer 420 in the region overlapping the first trench T1 can be smaller than a thickness of the light emitting layer 420 in the region not overlapping the first trench T1. In the region overlapping the first trench T1, the light emitting layer 420 can be continuous along the inside of the first trench T1 and can have a concave shape.

The second electrode 430 is provided on the light emitting layer 420. The second electrode 430 can function as a cathode of the display apparatus. Like the light emitting layer 420, the second electrode 430 is formed in both the two contact portions C1 and C2 and the boundary region between the two contact portions C1 and C2. Also, since the second electrode 430 is formed on an upper surface of the light emitting layer 420 in the first trench T1, the second electrode 430 can be continuous along the inside of the first trench T1 and can have a concave shape in a region overlapping the first trench T1.

Since the display apparatus according to an embodiment of the present disclosure is formed in a top emission mode, the second electrode 430 can be formed of a transparent metal material such as indium tin oxide (ITO) or indium zinc oxide (IZO) so that light emitted from the light emitting layer 420 can be transmitted upward. In addition, the second electrode 430 can be formed of a single layer or multiple layers.

The filling layer 500 is provided on the second electrode 430. Since the display apparatus according to an embodiment of the present disclosure has a top emission type, the filling layer 500 can be formed of a transparent material to allow light emitted from the light emitting layer 420 to be transmitted upward. For example, the filling layer 500 can be formed of an organic material such as an acrylic resin, an epoxy resin, a phenolic resin, a polyamide resin, or a polyimide resin.

In addition, the filling layer 500 is formed to fill the inner space of the first trench T1. For example, the filling layer 500 is formed to fill at least a portion of the concave region of the second electrode 430. Accordingly, a size of a step difference between the region of the filling layer 500 overlapping the first trench T1 and the region of the filling layer 500 not overlapping the first trench T1 can be smaller than a size of a step difference between the region of the second electrode 430 overlapping the first trench T1 and the region of the second electrode 430 not overlapping the first trench T1.

Figure 3:
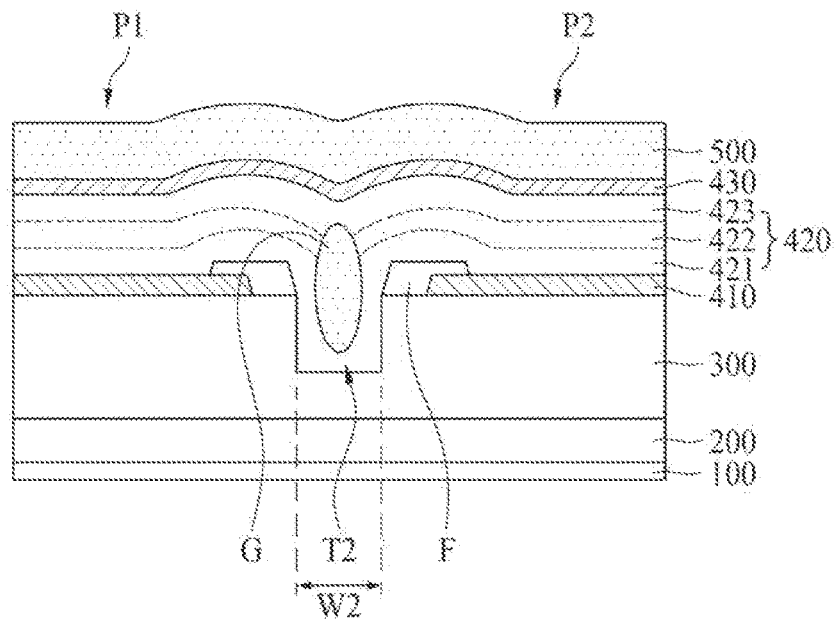
FIG. 3 is a schematic cross-sectional view of a display apparatus illustrating an example of a region across line II-II' of FIG. 1.

FIG. 3 is a schematic cross-sectional view of a display apparatus illustrating an example of region across line II-II' of FIG. 1, wherein the first subpixel P1, the second subpixel P2, and a boundary region between the first subpixel P1 and the second subpixel P2 is shown.

Since the substrate 100 and the circuit element layer 200 shown in FIG. 3 have the same structure as the substrate 100 and the circuit element layer 200 of the display apparatus according to FIG. 2 described above, a description thereof is omitted or may be briefly provided.

A second trench T2 is provided in the insulating layer 300 in the boundary region between the first subpixel P1 and the second subpixel P2. The second trench T2 can penetrate through the fence F and can extend to a predetermined region inside the insulating layer 300 without penetrating the insulating layer 300. However, the present disclosure is not limited thereto, and the second trench T2 can penetrate through the fence F and the insulating layer 300 and can extend to a predetermined region inside the circuit element layer 200 therebelow. Also, a width W2 of the second trench T2 can be less than a width W1 of the first trench T1 of FIG. 2.

The fence F can be formed in a matrix structure in the boundary region between the two subpixels P1 and P2 and cover both ends of the first electrode 410 provided in each of the subpixels P1 and P2. Accordingly, an exposed region of the first electrode 410 that is not covered by the fence F is a light emitting region.

In addition, since the fence F is formed to cover a portion of the upper surface and the side surface of the end of the first electrode 410, a problem in which a current is concentrated on the end of the first electrode 410 to degrade luminous efficiency can be prevented. In addition, the fence F can be formed of an inorganic insulating film, but is not necessarily limited thereto, and can be formed of an organic insulating film.

The light emitting layer 420 is formed on the insulating layer 300, the fence F, and the first electrode 410. For example, the light emitting layer 420 is formed in both the subpixels P1 and P2 and the boundary region between the two subpixels P1 and P2.

As described above, the light emitting layer 420 can include a first stack 421, a charge generating layer 422, and a second stack 423.

The light emitting layer 420 is formed inside and above the second trench T2. When the light emitting layer 420 is formed in the second trench T2, at least a portion of the light emitting layer 420 is disconnected, thereby preventing an occurrence of a leakage current between the adjacent subpixels P1 and P2.

The first stack 421 can be formed on an inner side surface and a lower surface of the second trench T2. In this case, at least a portion of the first stack 421 may not be continuous and can be disconnected in the second trench T2. For example, at least one of the hole injection layer, the first hole transport layer, the first organic light emitting layer, and the first electron transport layer constituting the first stack 421 can be disconnected in the second trench T2. A portion of the first stack 421 can be continuous in the second trench T2. For example, some of the hole injection layer, the first hole transport layer, the first organic light emitting layer, and the first electron transport layer constituting the first stack 421 can be formed to be continuous on the side surface and the lower surface of the second trench T2.

The charge generating layer 422 is provided on the first stack 421. In this case, the charge generating layer 422 can be disconnected inside the second trench T2 or a region overlapping the second trench T2. Accordingly, charges cannot move through the charge generating layer 422 between the subpixels P1 and P2 disposed adjacent to each other with the second trench T2 interposed therebetween.

The second stack 423 can be formed on the charge generating layer 422. In this case, at least a portion of the second stack 423 may not be continuous and can be disconnected between the subpixels P1 and P2 disposed adjacent to each other with the second trench T2 interposed therebetween. For example, at least one of the second hole transport layer, the second organic light emitting layer, and the second electron transport layer constituting the second stack 423 can be disconnected on the charge generating layer 422. Also, a portion of the second stack can be continuous between the subpixels P1 and P2 disposed adjacent to each other with the second trench T2 interposed therebetween. For example, some of the second hole transport layer, the second organic light emitting layer, and the second electron transport layer constituting the second stack 423 can be formed to be continuous on the charge generating layer 422. Accordingly, charges can move through the second stack 423 between the subpixels P1 and P2 disposed adjacent to each other with the second trench T2 interposed therebetween.

In this case, a thickness of the second stack 423 overlapping the second trench T2 region can be smaller than a thickness of the second stack 423 not overlapping the second trench T2 region. Specifically, since the second stack 423 is deposited and contacted while being spaced apart from each other on the upper surfaces of the left and right charge generating layers 422 spaced apart from each other with the second trench T2 interposed therebetween, a portion of the lower surface of the second stack 423 can be disconnected above the second trench T2. For example, at least one of the second hole transport layer, the second organic light emitting layer, and the second electron transport layer constituting the second stack 423 can be disconnected in a region overlapping the second trench T2.

A filling layer is filled in the void G of the light emitting layer 420. Specifically, the void G and the filling layer can be provided inside the second trench T2 and can extend upward from the second trench T2. At this time, the void G and the end of the filling layer can be formed at a position higher than the charge generating layer 422, so that the charge generating layer 422 can be disconnected on the second trench T2 due to the void G and the filling layer.

The second electrode 430 is provided on the second stack 423, and the filling layer 500 is provided on the second electrode 430. In addition, the filling layer 500 provided on the second electrode 430 is formed of the same material as the filling layer filling the void G.

Figure 4:
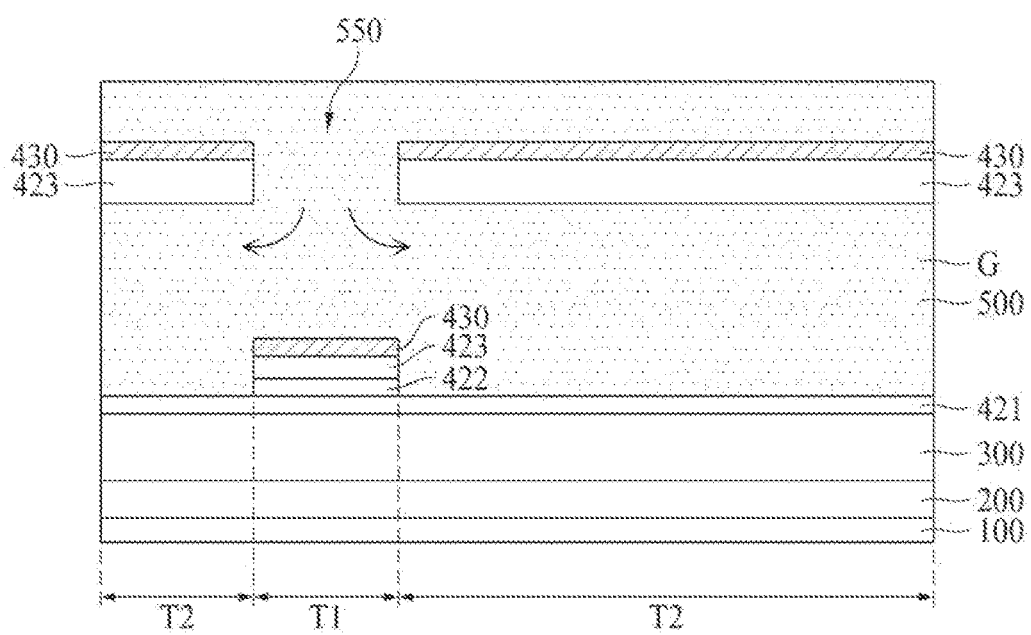
FIG. 4 is a schematic cross-sectional view of a display apparatus illustrating an example of region across line of FIG. 1.

FIG. 4 is a schematic cross-sectional view of a display apparatus illustrating an example of region across line of FIG. 1, in which a region between adjacent contact portions C2 and C3 and trench regions T1 and T2 between adjacent subpixels P2 and P3 are shown.

Since the substrate 100 and the circuit element layer 200 shown in FIG. 4 have the same structure as the substrate 100 and the circuit element layer 200 of the display apparatus according to FIG. 2 described above, a description thereof is omitted or may be briefly provided.

The insulating layer 300 is provided on the circuit element layer 200, and in FIG. 4, the insulating layer 300 forming lower surfaces of the first and second trenches T1 and T2 is shown. Accordingly, a thickness of the insulating layer 300 of FIG. 4 is shown to be relatively smaller than a thickness of the insulating layer 300 of FIGS. 2 and 3 described above. The first trench T1 and the second trench T2 are connected, an opening 550 is provided in the first trench T1 region, and the opening 550 is not provided in the second trench T2 region.

A first stack 421, a charge generating layer 422, a second stack 423, and a second electrode 430 can be provided on a lower surface of the first trench T1. This corresponds to a cross-section of the central portion of the first trench T1 in FIG. 2 described above.

The filling layer 500 is provided in the void G inside the second trench T2, the first stack 421 is provided on a lower surface inside the second trench T2, specifically, below the filling layer 500 provided in the void G, the second stack 423 can be provided above the filling layer 500 provided in the void G. Since the charge generating layer 422 is disconnected by the void G and the filling layer 500, the charge generating layer 422 is not shown in FIG. 4. This corresponds to a cross-section of the central portion of the second trench T2 in FIG. 3 described above.

Since the width W1 of the first trench T1 is greater than the width W2 of the second trench T2, the first stack 421 material can be more easily deposited inside the first trench T1 in the process of depositing the first stack 421, and thus, the thickness of the first stack 421 provided on the lower surface of the first trench T1 can be greater than the thickness of the first stack 421 provided on the lower surface of the second trench T2.

The filling layer 500 introduced through the opening 550 fills the entire inner region of the first trench T1 and expands into the void G based on the second trench T2 to fill the inner space of the second trench T2. At this time, a volume of the void G into which the filling layer 500 is introduced can be greater than a volume of the void G before the filling layer 500 is formed. For example, as the filling layer 500 is introduced, a size of the void G can be increased.

The filling layer 500 provided in the first trench T1 can be in contact with the first stack 421 and the second stack 422 in contact with the region overlapping the second trench T2, and a filling material filling the void G can be in contact with the first stack 421, the charge generating layer 422, and the second stack 423 provided in the first trench T1.

An encapsulation layer and a color filter can be provided on the second electrode 430.

As a result, in the present disclosure, by providing the first trench T1 having a relatively large width between the contact portions C1 to C3 adjacent to each other and providing the second trench T2 having a relatively small width between the subpixels P1 to P3 adjacent to each other, the opening 550 can be formed in the first trench T1 region and the void G is formed in the second trench T2 region. As an example, the second trench T2 may be provided between a first electrode of a first subpixel P1 and a first electrode provided in a second subpixel P2, and the first trench T1 may be provided between a first contact portion C1 provided on one side of the first subpixel P1 and a second contact portion C2 provided on one side of the second subpixel P2. Here, the filling layer 500 is introduced through the opening 550 of the first trench T1 region and the introduced filling layer 500 increases a volume of the void G, while filling an internal space of the void G of the second trench T2 region to disconnect the charge generating layer 422, thereby stably preventing an occurrence of a leakage current flowing in the boundary region between the adjacent subpixels P1 to P3.

Specifically, the charge generating layer 422 has conductivity higher than the first stack 421 and the second stack 423. In particular, since the N-type charge generating layer constituting the charge generating layer 422 can include a metal material, conductivity thereof is higher than that of the first stack 421 and the second stack 423. For example, charges between the subpixels P1 and P2 disposed adjacent to each other can be mainly transferred through the charge generating layer 422, and the amount of transfer of charges through the second stack 423 is insignificant. Therefore, by forming the charge generating layer 422 to be disconnected inside the second trench T2, the transfer of charges between the subpixels P1 to P3 disposed adjacent to each other can be reduced to thereby prevent an occurrence of a leakage current. In addition, due to expansion of the void G, a step difference of the upper surface of the second electrode 430 and the light emitting layer 420 of the region overlapping the second trench T2 can be reduced, thereby stably depositing the encapsulation layer on the second electrode 430.

FIGS. 5A to 5D are cross-sectional views illustrating a process of forming a display apparatus according to an embodiment of the present disclosure.

Figure 5A:
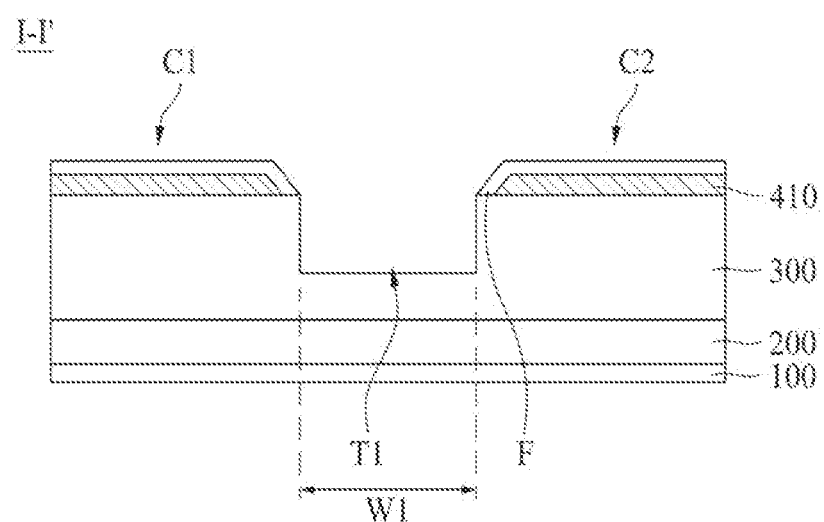
FIGS. 5A to 5D are cross-sectional views illustrating a process of forming a display apparatus according to an embodiment of the present disclosure.
Figure 5A:
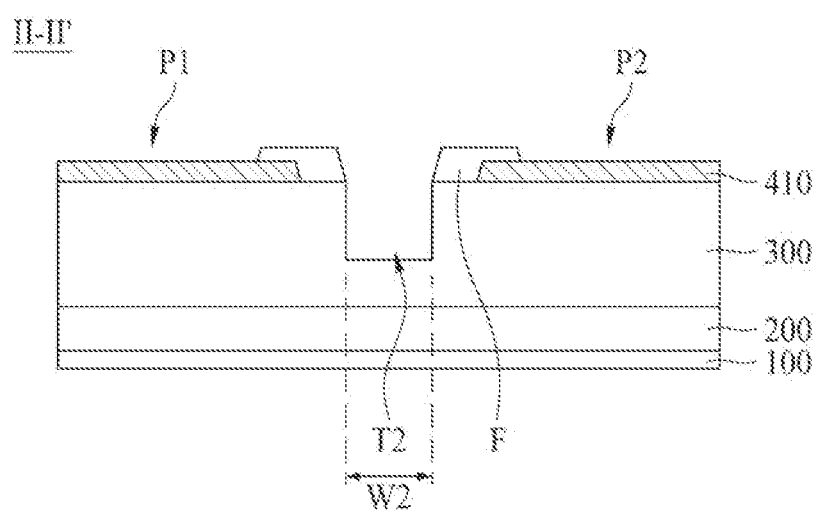

Referring to FIG. 5A, the circuit element layer 200 is formed on the substrate 100, the insulating layer 300 is formed on the circuit element layer 200, the first electrode 410 is formed on the insulating layer 300, the fence F is formed on the first electrode 410, and the first and second trenches T1 and T2 are formed in the fence F and the insulating layer 300. The first trench T1 is formed by etching the fence F and the insulating layer 300 in the region between the first and second contact portions C1 and C2, and the second trench T2 is formed by etching the fence F and the I insulating layer 300 in the region between the first and second subpixels P1 and P2. Here, as described above, a width W1 of the first trench T1 is greater than a width W2 of the second trench T2.

Figure 5B:
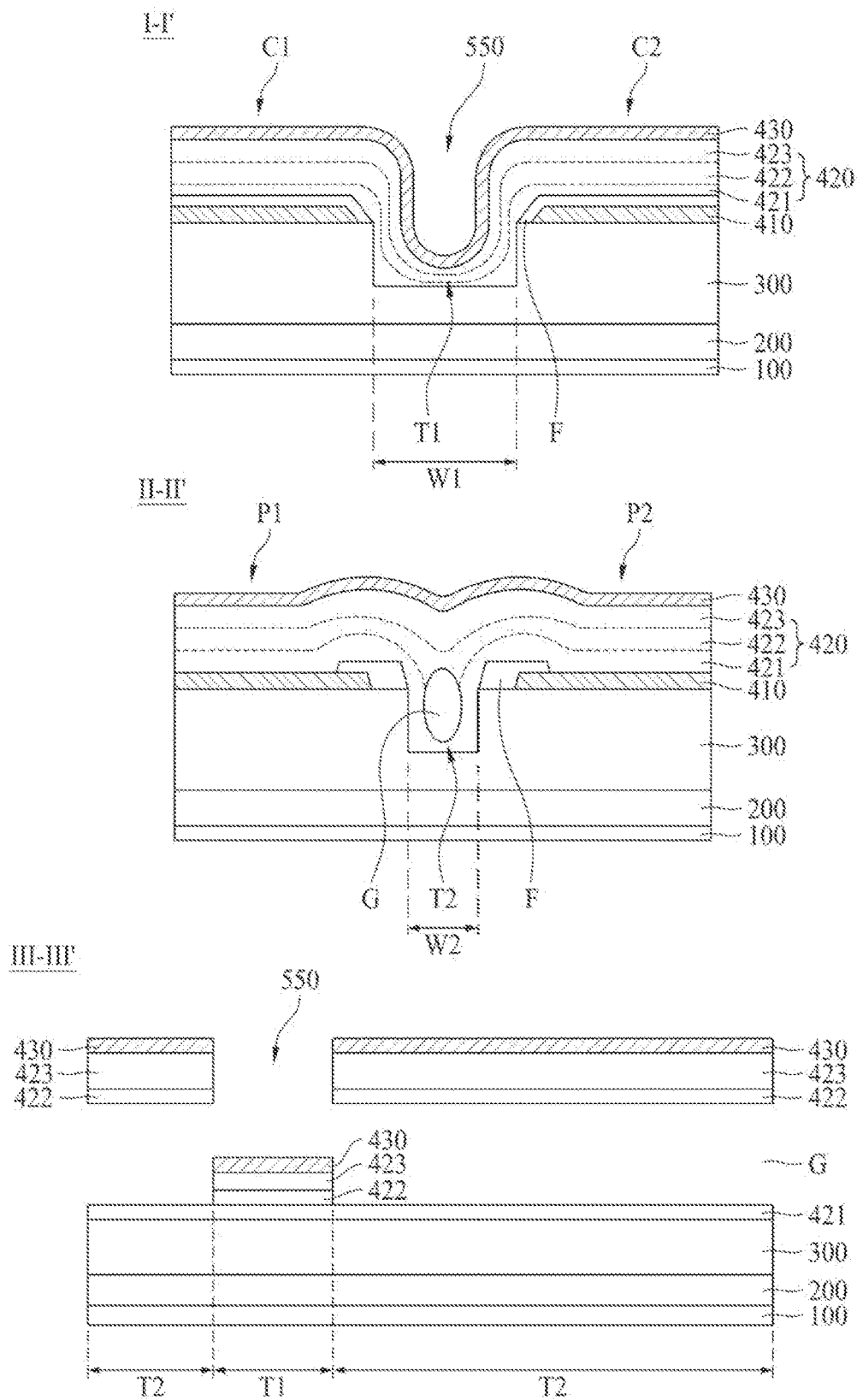

Referring to FIG. 5B, the light emitting layer 420 is formed on the insulating layer 300, fence F, and the first electrode 410. For example, the first stack 421, the charge generating layer 422, and the second stack 423 can be sequentially deposited on the insulating layer 300, the fence F, and the first electrode 410 to form the light emitting layer 420. Also, the second electrode 430 is formed on the light emitting layer 420.

At this time, the light emitting layer 420 can be formed to cover the side surface and lower surface inside the first trench T1, and a region of the light emitting layer 420 overlapping the first trench T1 can have a concave shape, and an opening 550 can be provided. Also, the first stack 421, the charge generating layer 422, and the second stack 423 can be continuously formed, i.e., may be connected to each other in the first trench T1.

The light emitting layer 420 can be formed to cover the side surface and lower surface inside the second trench T2. Since the width W2 of the second trench T2 is smaller than the width W1 of the first trench T1, the first stack 421 is not uniformly deposited in the second trench T2, so that at least a portion of the first stack 421 may not be continuous and can be disconnected in the second trench T2, and in some cases, a portion of the first stack 421 can be continuous in the second trench T2. Also, the charge generating layer 422 can be not continuous and can be disconnected inside of the second trench T2 or on the second trench T2. Also, the second stack 423 can be continuous above the second trench T2, but a portion of the second stack 423 can be disconnected above the second trench T2. Accordingly, a void G is formed in the light emitting layer 420 in the region overlapping the second trench T2. That is, in the present invention, a portion of the light emitting layer 420 may be continuous in the first trench T1 and may be disconnected in the second trench T2.

Figure 5C:
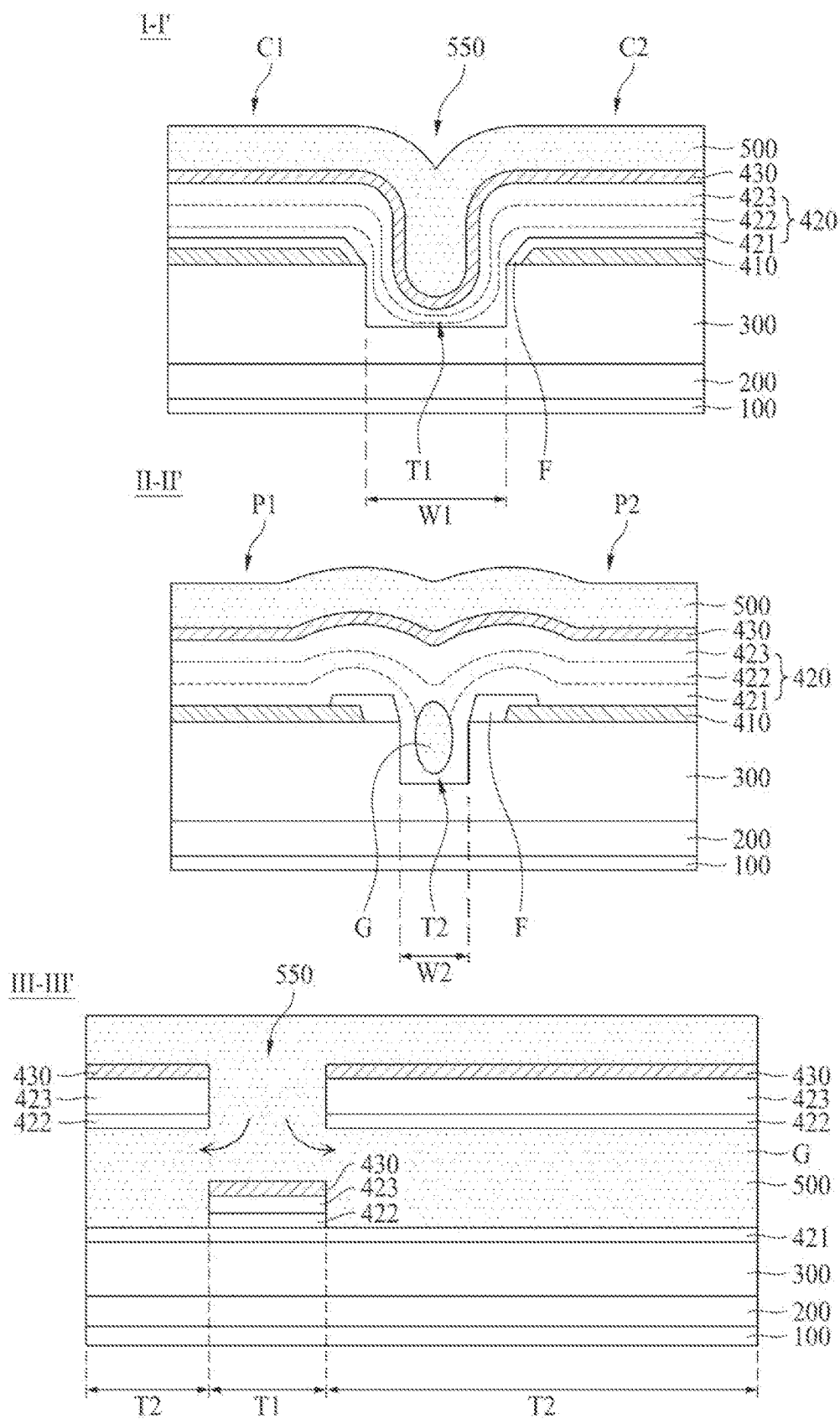

Referring to FIG. 5C, the filling layer 500 is formed on the second electrode 430. Specifically, due to a pressure difference in a deposition chamber or a capillary phenomenon, the filling material introduced through the opening 550 can fill the inside of the first trench T1 and move to the second trench T2 to fill the inner space of the void G. When the inner spaces of the first and second trenches T1 and T2 are filled with the filling material, the filling material is also provided on the second electrode 430, and the filling layer 500 is formed to cover the second electrode 430. In addition, the filling layer 500 in the region overlapping the first and second trenches T1 and T2 can have a concave shape, and since the width W2 of the second trench T2 is smaller than the width W1 of the first trench T1, a width of the concave shape of the second trench T2 can be narrower.

Figure 5D:
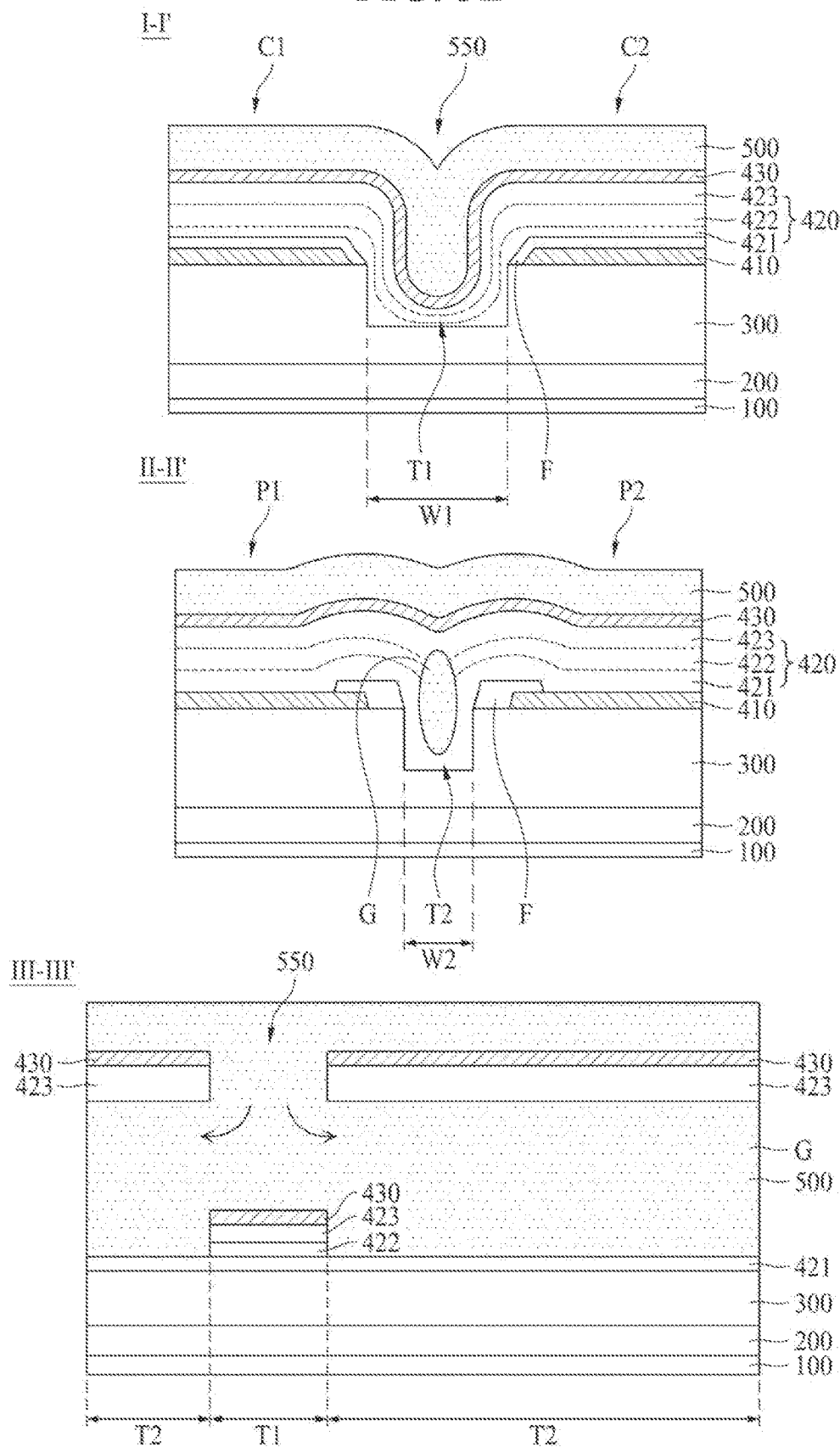

Referring to FIG. 5D, due to the difference in pressure between the inside and outside of the void G or a density difference between the light emitting layer 420 and the filling layer 500 according to the curing process, the volume of the filling layer 500 filling the inner space of the void G is increased. Since the void G is surrounded by the side surface of the second trench T2, a height of the void G can increase by further expanding in the vertical direction than in the horizontal direction. Accordingly, the end of the void G is formed at a position higher than the charge generating layer 422, thereby completely short-circuiting the charge generating layer 422 on the second trench T2. Also, a portion of the lower surface of the second stack 423 can be short-circuited. For example, at least one of the second hole transport layer, the second organic light emitting layer, and the second electron transport layer constituting the second stack 423 can be disconnected in a region overlapping the second trench T2. In addition, the void G can expand to push the second stack 423, the second electrode 430, and the filling layer 500 formed on the void G in the vertical direction, thereby compensating for the step difference of the filling layer 500 in the region overlapping the second trench T2.

Figure 6:
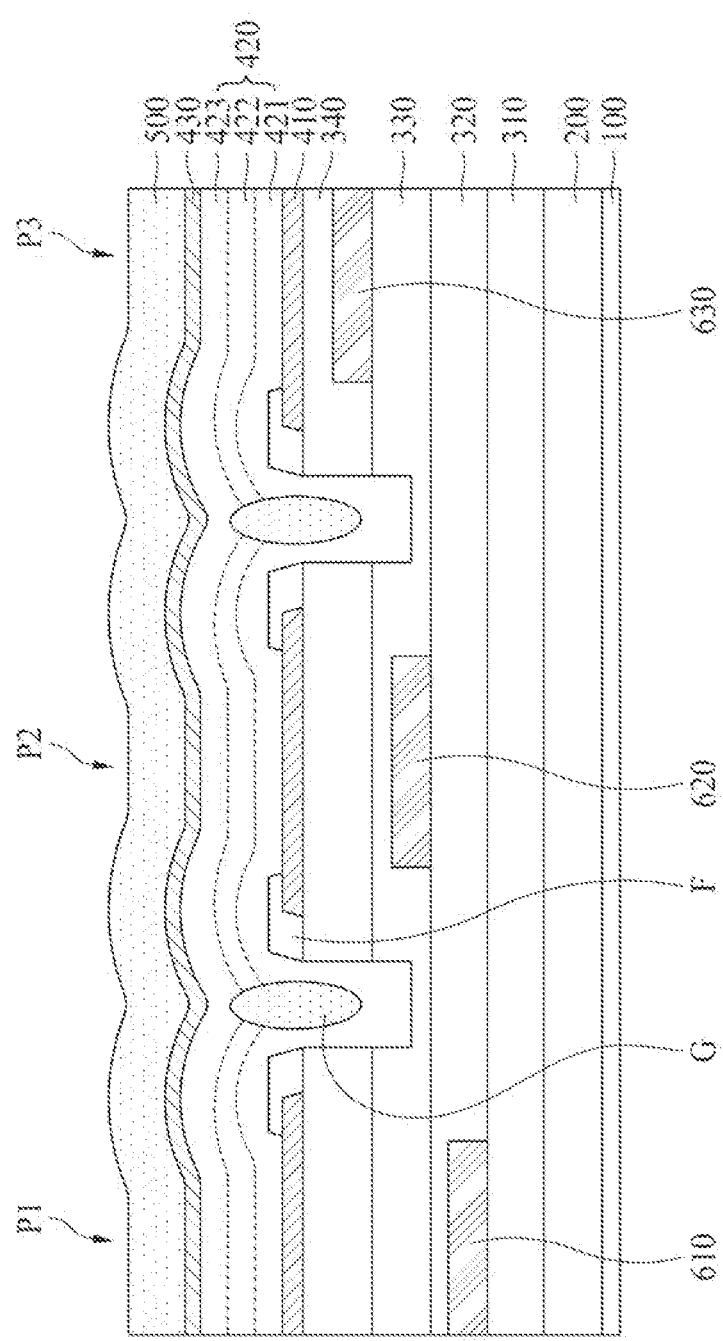
FIG. 6 is a cross-sectional view illustrating another example of a display apparatus according to an embodiment of the present disclosure.

FIG. 6 is a cross-sectional view illustrating another example of a display apparatus according to the present disclosure.

Referring to FIG. 6, a display apparatus according to another example of the present disclosure shows the first to third subpixels P1, P2, and P3 and a boundary region between neighboring subpixels.

The insulating layer 300 can include first to fourth insulating layers 310, 320, 330, and 340. A first reflective electrode 610 can be provided on an upper surface of the first insulating layer 310 in the first subpixel P1 region, a second reflective electrode 620 can be provided on an upper surface of the second insulating layer 320 in the second subpixel P2 region, a third reflective electrode 630 can be provided on an upper surface of the third insulating layer 330 in the third subpixel P3 region. Also, the fourth insulating layer 340 can be formed to cover the third reflective electrode 630.

The first to third reflective electrodes 610, 620, and 630 are formed of silver (Ag) or a metal material containing silver (Ag), and emit light emitted from the light emitting layer 420 in a direction of the second electrode 430.

Further, a distance between the first reflective electrode 610 and the second electrode 430 can be greater than a distance between the second reflective electrode 620 and the second electrode 430, and a distance between the second reflective electrode 620 and the second electrode 430 can be greater than a distance between the third reflective electrode 630 and the second electrode 430. As described above, by forming different distances between the first to third reflective electrodes 610, 620, and 630 and the second electrode 430, light of different colors can be extracted using microcavity characteristics.

Specifically, as the distance between the first to third reflective electrodes 610, 620, and 630 and the second electrode 430 increases, long-wavelength light extraction efficiency can be improved, so that light extraction efficiency of red light from the first reflective electrode 610 and the second electrode 430 can be improved, and also, as the distance between the first to third reflective electrodes 610, 620, and 630 and the second electrode 430 decreases, short-wavelength light extraction efficiency can be improved, so that light extraction efficiency of blue light between the third reflective electrode 630 and the second electrode 430 can be improved. In addition, since the distance between the second reflective electrode 620 and the second electrode 430 is shorter than the distance between the first reflective electrode 610 and the second electrode 430 and longer than the distance between the third reflective electrode 630 and the second electrode 430, light extraction efficiency of green light can be improved.

Accordingly, light extraction efficiency of red light is improved to emit red light in the first subpixel P1, the light extraction efficiency of green light is improved to emit green light in the second subpixel P2, and light extraction efficiency of blue light is improved to emit blue light in the third subpixel P3.

Figure 7A:
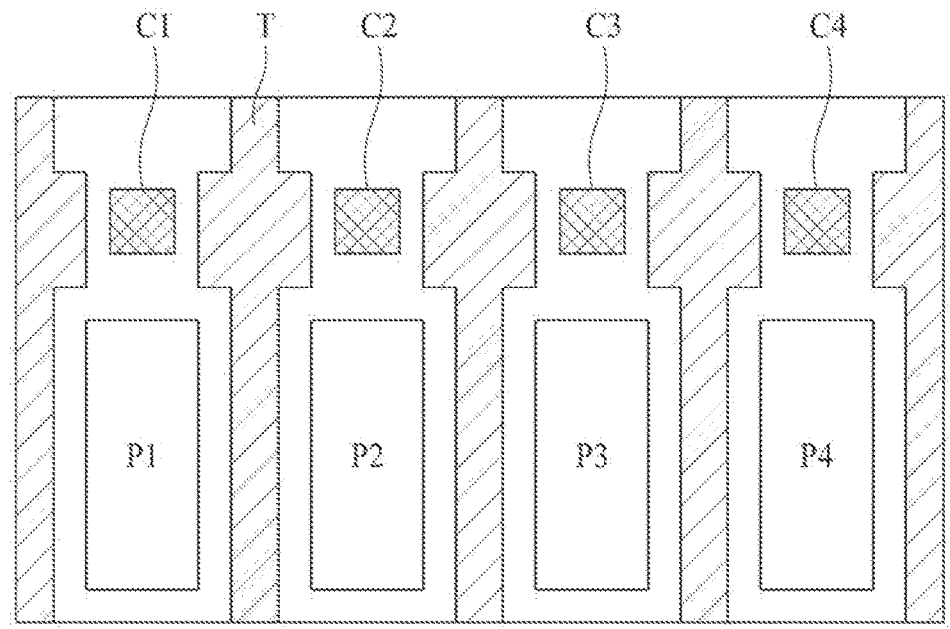
FIGS. 7A and 7B are plan views illustrating another example of a pixel structure of a display apparatus according to an embodiment of the present disclosure.
Figure 7B:
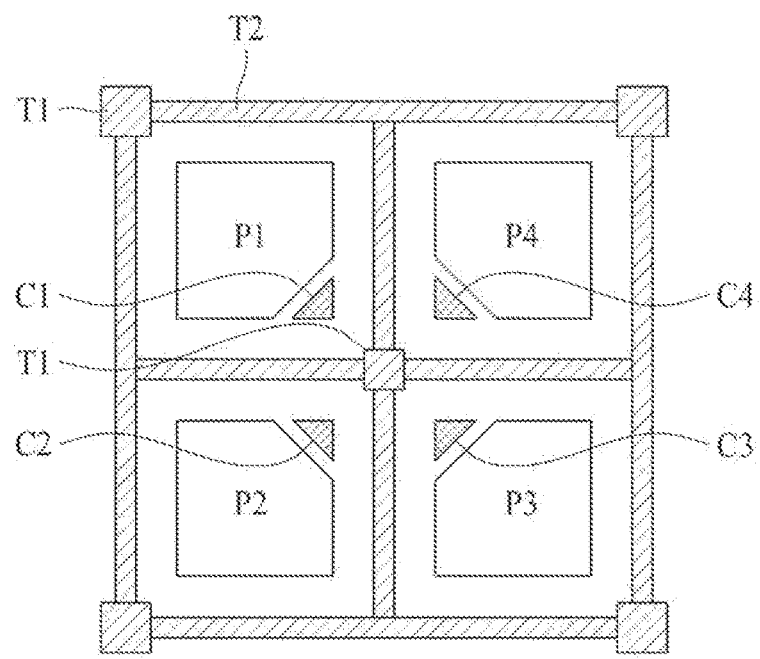

FIGS. 7A and 7B are plan views illustrating another example of a pixel structure of a display apparatus according to the present disclosure.

Referring to FIG. 7A, the display apparatus can further include a fourth contact portion C4 adjacent to the third contact portion C3 and a fourth subpixel P4 adjacent to the third subpixel P3. A trench T is also provided in a boundary region between the third subpixel P3 and the fourth subpixel P4.

Referring to FIG. 7B, a structure in which the first to fourth subpixels P1-P4 and the first to fourth contact portions C1 to C4 are surrounded by the first and second trenches T1 and T2 is illustrated. For example, the first subpixel P1 is adjacent to the second subpixel P2 and the fourth subpixel P4, and the second trench T2 is provided in a boundary region between the first subpixel P1 and the second subpixel P2 and a boundary region between the first subpixel P1 and the fourth subpixel P4. Also, the second subpixel P2 is adjacent to the first subpixel P1 and the third subpixel P3, and the second trench T2 is provided in a boundary region between the second subpixel P2 and the first subpixel P1 and in a boundary region between the second subpixel P2 and the third subpixel P3. Also, the third subpixel P3 is adjacent to the second subpixel P2 and the fourth subpixel P4, and the second trench T2 is provided in a boundary region between the third subpixel P3 and the second subpixel P2 and in a boundary region between the third subpixel P3 and the fourth subpixel P4.

The first to fourth contact portions C1 to C4 are provided in the corner regions of the first to fourth subpixels P1 to P4, and the second trench T2 is also provided between the adjacent contact portions C1 to C4. When one pixel is configured to include the first to fourth subpixels P1 to P4 and the first to fourth contact portions C1 to C4, the first trench T1 can be provided at each corner of the pixel and the second trench T2 can be formed to connect the first trench T1 and surround the pixel. Also, a width of the first trench T1 can be greater than a width of the second trench T2. As an example, the first trench T1 may be provided in the center of the first to fourth contact portions C1 to C4, and the second trench T2 may be provided in a region between the subpixels adjacent to each other and between the contact portions adjacent to each other.

Figure 8A:
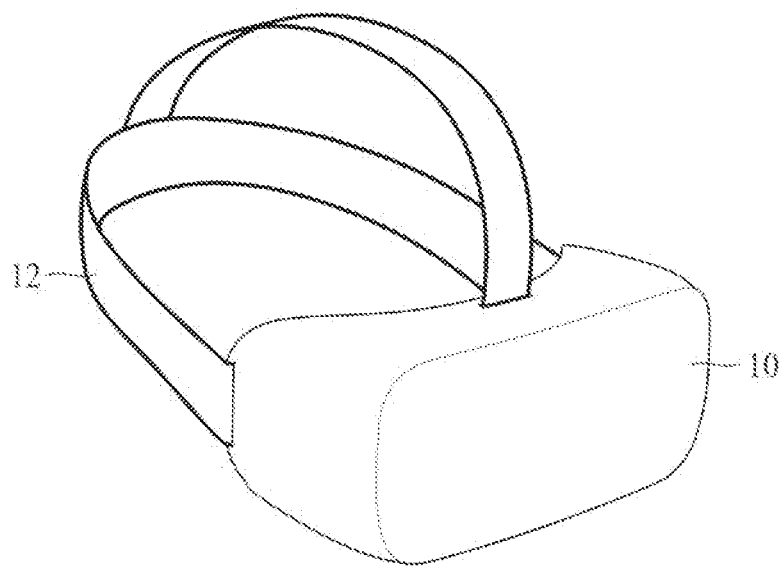
FIGS. 8A to 8C relate to a display apparatus according to another embodiment of the present disclosure, which relates to a head-mounted display (HMD) apparatus.
Figure 8B:
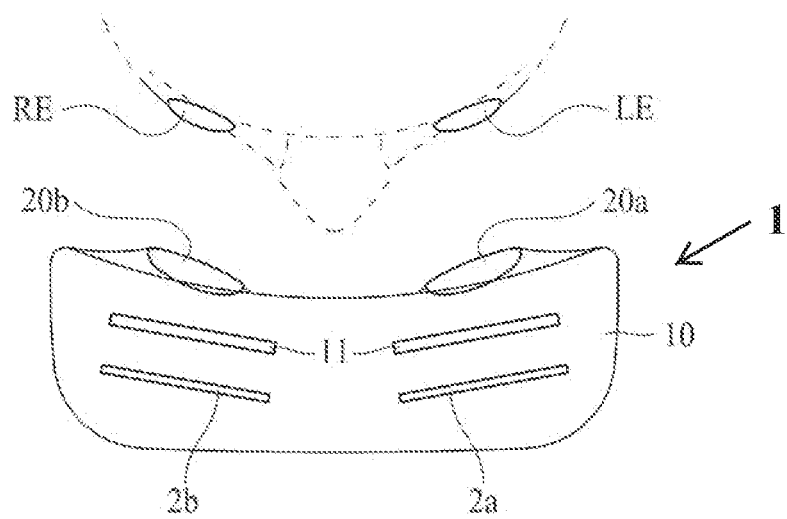
Figure 8C:
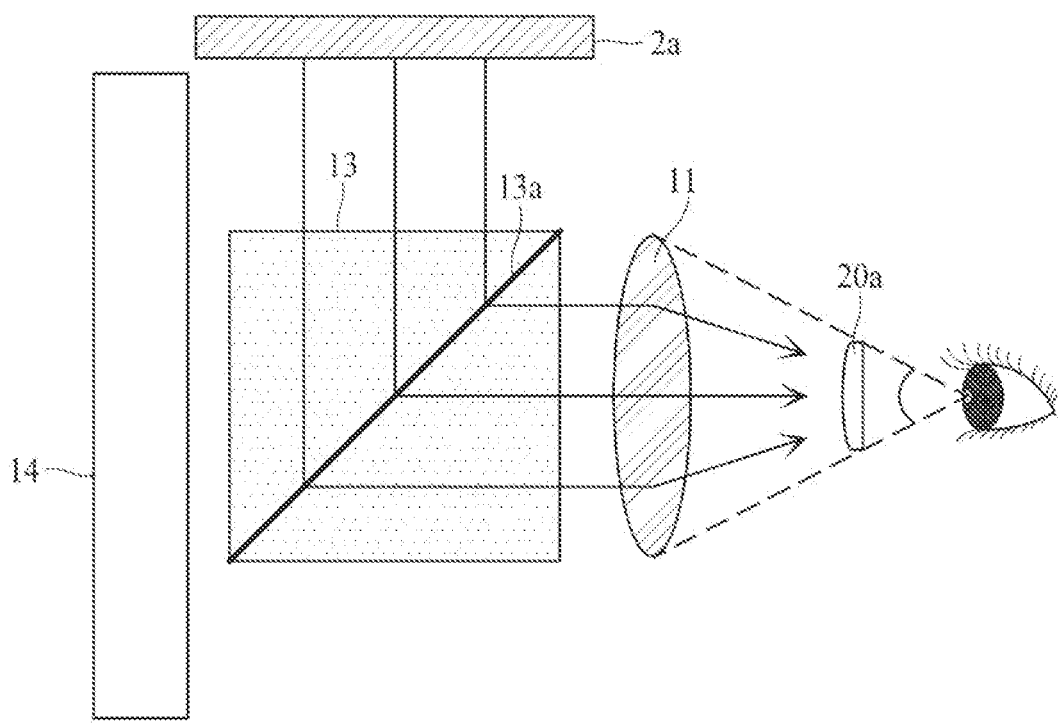

FIGS. 8A to 8C relate to a display apparatus according to another embodiment of the present disclosure, which relates to a head mounted display (HMD) apparatus.

Referring to FIG. 8A, the HMD apparatus according to the present application includes a storage case 10 and a head mounted band 12.

The storage case 10 houses a display apparatus, a lens array, and an eyepiece therein. The head mounted band 12 is fixed to the storage case 10.

The head mounted band 12 is shown to be formed to surround an upper surface and both side surfaces of the user's head, but is not limited thereto. The head mounted band 12 is for fixing the HMD to the user's head, and can be replaced with a structure in the form of glasses frame or helmet.

As can be seen from FIG. 8B, the HMD apparatus having a virtual reality (VR) structure according to the present disclosure can include a left-eye display apparatus 2a and a right-eye display apparatus 2b, a lens array 11, and a left eyepiece 20a and a right eyepiece 20b.

The left-eye display apparatus 2a and the right-eye display apparatus 2b, the lens array 11, and the left eyepiece 20a and the right eyepiece 20b are accommodated in the storage case 10 described above.

The left-eye display apparatus 2a and the right-eye display apparatus 2b can display the same image, and in this case, the user can view a 2D image. Alternatively, the left-eye display apparatus 2a can display a left-eye image and the right-eye display apparatus 2b can display a right-eye image. In this case, the user can view a stereoscopic image. Each of the left-eye display apparatus 2a and the right-eye display apparatus 2b can include the display apparatus based on FIGS. 1 to 5D described above. For example, each of the left-eye display apparatus 2a and the right-eye display apparatus 2b can be an organic light emitting display.

Each of the left-eye display apparatus 2a and the right-eye display apparatus 2b can include a plurality of subpixels, a circuit element layer 200, an insulating layer 300, a first electrode 410, a light emitting layer 420, and a second electrode 430 and display various images by combining colors of light emitted from each subpixel in various ways.

The lens array 11 can be provided between the left eyepiece 20a and the left eye display apparatus 2a and can be spaced apart from each of the left eyepiece 20a and the left eye display apparatus 2a. For example, the lens array 11 can be located in front of the left eyepiece 20a and behind the left-eye display apparatus 2a. In addition, the lens array 11 can be provided between the right eyepiece 20b and the right eye display apparatus 2b, while being spaced apart from each of the right eyepiece 20b and the right eye display apparatus 2b. For example, the lens array 11 can be positioned in front of the right eyepiece 20b and behind the right eye display apparatus 2b.

The lens array 11 can be a micro lens array. The lens array 11 can be replaced with a pin hole array. Due to the lens array 11, an image displayed on the left-eye display apparatus 2a or the right-eye display apparatus 2b can be enlarged to be seen by the user.

The user's left eye LE can be located in the left eyepiece 20a, and the user's right eye RE can be located in the right eyepiece 20b.

As can be seen from FIG. 8C, the HMD apparatus having an augmented reality (AR) structure according to the present disclosure includes a left-eye display apparatus 2a, a lens array 11, a left-eye eyepiece 20a, a transmissive reflector 13, and a transmissive window 14. FIG. 8C shows only a left eye configuration for convenience, and a right eye configuration is also the same as the left eye configuration.

The left eye display apparatus 2a, the lens array 11, the left-eye eyepiece 20a, the transmissive reflector 13, and the transmissive window 14 are accommodated in the storage case 10 described above.

The left-eye display apparatus 2a can be disposed on one side, e.g., on an upper side, of the transmissive reflector 13 without blocking the transmissive window 14. Accordingly, the left-eye display apparatus 2a can provide an image to the transmissive reflector 13 without blocking an external background viewed through the transmissive window 14.

The left-eye display apparatus 2a can include the display apparatus based on FIGS. 1 to 4 described above. Here, an upper portion corresponding to a surface on which an image is displayed faces the transmissive reflector 13 in FIGS. 1 to 4.

The lens array 11 can be provided between the left-eye eyepiece 20a and the transmissive reflector 13. The left eye of the user is located in the left-eye eyepiece 20a.

The transmissive reflector 13 is disposed between the lens array 11 and the transmissive window 14. The transmissive reflector 13 can include a reflective surface 13a that transmits a portion of light and reflects another portion of the light. The reflective surface 13a is formed so that an image displayed on the left-eye display apparatus 2a moves to the lens array 11. Accordingly, the user can view both an external background and the image displayed by the left-eye display apparatus 2a through the transmissive window 14. For example, since the user can view a single image by overlapping a real background and a virtual image, augmented reality (AR) can be implemented.

The transmissive window 14 is disposed in front of the transmissive reflector 13.

According to the present disclosure, by forming the filling layer inside and in an upper portion of the light emitting layer, stable encapsulation layer can be provided, while preventing an occurrence of a lateral leakage current.

The above-described feature, structure, and effect of the present disclosure are included in at least one embodiment of the present disclosure, but are not limited to only one embodiment. Furthermore, the feature, structure, and effect described in at least one embodiment of the present disclosure can be implemented through combination or modification of other embodiments by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A display apparatus comprising:
   an insulating layer provided on a substrate;
   a plurality of subpixels and a plurality of contact portions provided on one side of each of the plurality of subpixels on the insulating layer:
   a first electrode provided in each of the plurality of subpixels and each of the plurality of contact portions;
   a fence provided on the first electrode;
   a light emitting layer provided on the insulating layer, the fence, and the first electrode;
   a second electrode provided on the light emitting layer;

a filling layer provided on the second electrode; and a trench provided in the fence and the insulating layer, wherein the trench includes a first trench provided between the contact portions adjacent to each other and a second trench provided between the subpixels adjacent to each other, the light emitting layer includes a void in the second trench, and the void is filled with a filler which is the same as a material constituting the filling layer.

2. The display apparatus of claim 1, wherein a width of the first trench is greater than a width of the second trench.

3. The display apparatus of claim 1, wherein the first trench and the second trench are connected to each other.

4. The display apparatus of claim 1, wherein the second electrode is continuous along an inside of the first trench and has a concave shape, and the filling layer fills at least a portion of the concave region of the second electrode.

5. The display apparatus of claim 1, wherein the light emitting layer provided inside the first trench includes a first stack, a charge generating layer, and a second stack being sequentially stacked, and the first stack, the charge generating layer, and the second stack are connected to each other inside the first trench.

6. The display apparatus of claim 5, wherein the filler filling the void is in contact with the first stack, the charge generating layer, and the second stack provided inside the first trench.

7. The display apparatus of claim 1, wherein the light emitting layer provided in a region overlapping the second trench includes a first stack, a charge generating layer, and a second stack, and the charge generating layer is disconnected inside the second trench.

8. The display apparatus of claim 7, wherein the filling layer provided in the first trench is in contact with the charge generating layer and the second stack in contact with the region overlapping the second trench.

9. The display apparatus of claim 1, further comprising:

a first reflective electrode, a second reflective electrode and a third reflective electrode inside the insulating layer.

10. The display apparatus of claim 9, wherein the plurality of subpixels include a first subpixel to a third subpixel, the insulating layer is formed by sequentially stacking a first insulating layer to a third insulating layer on a circuit element layer, the first reflective electrode is provided on the first insulating layer in the first subpixel region, the second reflective electrode is provided on the second insulating layer in the second subpixel region, and the third reflective electrode is provided on the third insulating layer in the third subpixel region.

11. The display apparatus of claim 5, wherein the void and an end of the filling layer is formed at a position higher than the charge generating layer.

12. The display apparatus of claim 1, wherein an opening is provided in a region corresponding to the first trench, and wherein the filling layer through the opening fills an entire inner region of the first trench and expands into the void based on the second trench to fill an inner space of the second trench.

13. A display apparatus comprising:

a substrate including a plurality of subpixels;

a first electrode provided in each of the plurality of subpixels on the substrate;

a light emitting layer provided on the first electrode;

a second electrode provided on the light emitting layer;

a filling layer provided on the second electrode; and a trench provided between the plurality of subpixels, wherein the trench includes a first trench having a first width and a second trench having a second width smaller than the first width, and a portion of the light emitting layer is continuous in the first trench and is disconnected in the second trench.

14. The display apparatus of claim 13, wherein the portion of the light emitting layer includes a charge generating layer.

15. The display apparatus of claim 13, wherein the light emitting layer includes a void in the second trench, and the void is filled with the same filler material as a material constituting the filling layer.

16. The display apparatus of claim 13, wherein the light emitting layer does not have a void in the first trench.

17. The display apparatus of claim 13, wherein the second trench is provided between a first electrode of a first subpixel and a first electrode provided in a second subpixel, and the first trench is provided between a first contact portion provided on one side of the first subpixel and a second contact portion provided on one side of the second subpixel.

18. The display apparatus of claim 13, wherein the plurality of subpixels include a first subpixel to a fourth subpixel, the first subpixel is adjacent to the second subpixel and the fourth subpixel, the second subpixel is adjacent to the first subpixel and the third subpixel, the third subpixel is adjacent to the second subpixel and the fourth subpixel, a first contact portion to a fourth contact portion are provided at corner regions of the first to fourth subpixels, respectively, the first trench is provided in a center of the first to fourth contact portions, and the second trench is provided in a region between the subpixels adjacent to each other and the between contact portions adjacent to each other.

19. The display apparatus of claim 18, wherein the first to fourth subpixels constitutes one pixel, the first trench is provided at a corner of the pixel, and the second trench connects the first trenches and surrounds the pixel.

20. The display apparatus of claim 15, wherein the light emitting layer includes a first stack, a charge generating layer, and a second stack being sequentially stacked, and wherein the void and an end of the filling layer is formed at a position higher than the charge generating layer.

* * * * *